United States Patent
Koo et al.

(10) Patent No.: US 7,049,631 B2
(45) Date of Patent: May 23, 2006

(54) ORGANIC THIN FILM TRANSISTOR COMPRISING BUFFER LAYER

(75) Inventors: Bon Won Koo, Gyeonggi-Do (KR); In Nam Kang, Gyeonggi-Do (KR); Sang Yoon Lee, Seoul (KR); Kook Min Han, Gyeonggi-Do (KR)

(73) Assignee: Samsung Electronics Co., Ltd., Suwon (KR)

( * ) Notice: Subject to any disclaimer, the term of this patent is extended or adjusted under 35 U.S.C. 154(b) by 85 days.

(21) Appl. No.: 10/843,296

(22) Filed: May 12, 2004

(65) Prior Publication Data

US 2005/0110008 A1    May 26, 2005

(30) Foreign Application Priority Data

Nov. 24, 2003  (KR) .................. 10-2003-0083584

(51) Int. Cl.
*H01L 35/24*   (2006.01)
(52) U.S. Cl. ........................... 257/40; 313/504
(58) Field of Classification Search .............. 257/40; 313/504
See application file for complete search history.

(56) References Cited

U.S. PATENT DOCUMENTS 6,855,949 B1 *   2/2005   De Leeuw et al. ........... 257/40

OTHER PUBLICATIONS

Hagen Klauk et al., "Contact Resistance in Organic Thin Film Transistors", Solid-State Electronics, 47, 2003, pp. 297-301.

* cited by examiner

*Primary Examiner*—Sara Crane
(74) *Attorney, Agent, or Firm*—Buchanan Ingersoll PC

(57) ABSTRACT

Disclosed herein is an organic thin film transistor comprising a substrate, a gate electrode, a gate insulating layer, an organic semiconductor layer, source-drain electrodes and a protective layer wherein a buffer layer is interposed between the organic semiconductor layer and the protective layer. Such a transistor minimizes the deterioration in the performance of the transistor due to ambient air containing oxygen and moisture, and the degeneration in the performance of the transistor caused during mounting a display device.

11 Claims, 5 Drawing Sheets

ORGANIC THIN FILM TRANSISTOR COMPRISING BUFFER LAYER

BACKGROUND OF THE INVENTION

This non-provisional application claims priority under 35 U.S.C. § 119(a) to Korean Patent Application No. 2003-83584 filed on Nov. 24, 2003, which is herein incorporated by reference.

1. Field of the Invention

The present invention relates to an organic thin film transistor comprising a buffer layer, and more particularly to an organic thin film transistor comprising a substrate, a gate electrode, a gate insulating layer, an organic semiconductor layer, source-drain electrodes and a protective layer. A buffer layer is interposed between the organic semiconductor layer and the protective layer, thereby minimizing the deterioration in the performance of the transistor caused by ambient air containing oxygen and moisture, and mounting process of a display device thereto.

2. Description of the Related Art

Recently, polymers have been actively investigated as novel electrical and electronic materials in a wide variety of applications (e.g., functional electronic and optical devices). The investigations have focused on easy molding into the form of fibers and films, high flexibility, high conductivity and low manufacturing costs. Among devices fabricated from these conductive polymers, research on organic thin film transistors fabricated using organic materials as semiconductor layers has been conducted since the 1980's. In this connection, a number of studies are now being actively undertaken around the world. Organic thin film transistors are expected to be useful for driving devices of active displays and in plastic chips for use in smart cards and inventory tags. A device using an organic thin film transistor necessitates a protective layer for protecting the transistor from ambient air containing oxygen and moisture, and a supporting layer for mounting a display device, particularly in the case of a display application. There are currently no effective techniques for forming a protective layer or supporting layer in organic thin film transistors. Some attempts to form an inorganic film made of $SiN_x$, $SiO_x$, etc. on an organic thin film transistor by CVD or sputtering have been made, but the processes cause serious deterioration of the organic semiconductor layer due to active gases or plasma. This results in drastic reduction in the performance of the organic thin film transistor.

Several methods using an organic film made of a polyimide, BCB (benzocyclobutene) or photoacryl as a protective layer have been performed. However, these methods are not effective in forming a protective layer of an organic thin film transistor in that the organic active layer is drastically deteriorated at an annealing temperature higher than 150° C. The major problem caused in the film formation of a protective layer using an organic material is the direct contact between a material used to form the protective layer and an organic semiconductor layer. At this time, an organic solvent used in the formation of the protective layer deteriorates the performance of the organic semiconductor layer. Jackson, a professor at Penn. State University and his team tried to effectively form a protective layer using an organic film of PVA (polyvinyl alcohol). However, this method which used patterned pentacene as an organic semiconductor layer, has a problem in that the charge carrier mobility is decreased to ⅓ of its initial value after processing (Solid-State Electronics 47(2003) 297–301).

No approaches that can avoid a decrease in the performance of an organic thin film transistor caused upon forming an organic or inorganic film as a protective layer have been reported until now. Accordingly, development of novel protective layers and processes effective for forming the protective layers is necessitated to manufacture applied products using organic thin film transistors.

SUMMARY OF THE INVENTION

The present invention has been made in view of the above problems in the prior art. A feature of the present invention is to provide an organic thin film transistor wherein a buffer layer is interposed between an organic semiconductor layer and a protective layer so that the buffer layer prevents the deterioration of the organic semiconductor layer by a material used to form the protective layer and minimizes the degeneration in the performance of the transistor after formation of the protective layer.

In accordance with a feature of the present invention, there is provided an organic thin film transistor comprising a substrate, a gate electrode, a gate insulating layer, an organic semiconductor layer, source-drain electrodes and a protective layer wherein a buffer layer is interposed between the organic semiconductor layer and the protective layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail with reference to the accompanying drawings.

Figure 1A:
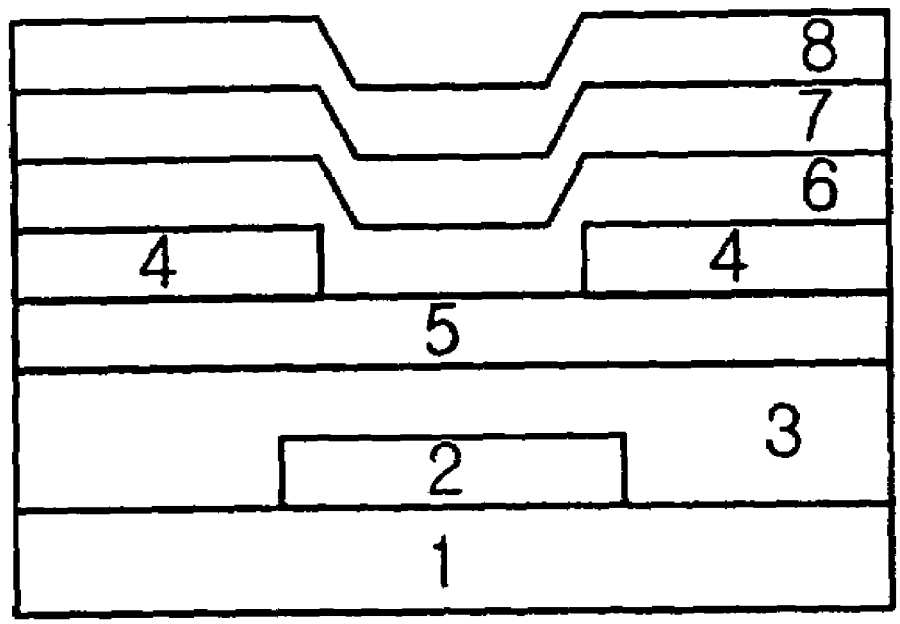
FIGS. 1a and 1b are cross-sectional views showing structures of organic thin film transistors according to the present invention.
Figure 1B:
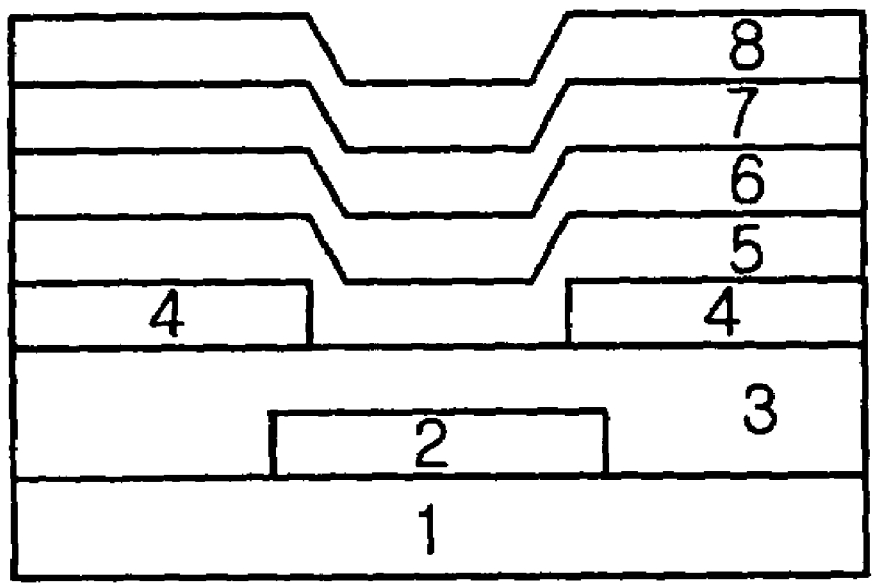

FIGS. 1a and 1b are cross-sectional views showing structures of organic thin film transistors according to the present invention. Referring to FIGS. 1a and 1b, the organic thin film transistor of the present invention comprises a substrate 1, a gate electrode 2, a gate insulating layer 3, source-drain electrodes 4, an organic semiconductor layer 5, a buffer layer 6, a first protective layer 7 and a second protective layer 8, and the buffer layer 6 is interposed between the organic semiconductor layer 5 and the first protective layer 7. The structures of the organic thin film transistor shown in FIGS. 1a and 1b are simply preferred embodiments, and it is to be understood that various structures of the organic thin film transistor comprising the buffer layer and the protective layer are possible so far as they do not detract from the object of the present invention.

The buffer layer is made of an organic material having a resistance of $10^6$ ohm-cm more. Specific examples of the organic material include, but are not limited to, Alq3 (tris (8-hydroxyquinoline)aluminum), BAlq3 (bis(2-methyl-8-quinolato) (p-phenyl-phenolato) aluminum), PTCDA (perylenetetra-carboxylicdianhydride), DPS (dicyano substituted diphenyl-sulfone), TCNQ (tetracyano-quinodimethane), DCAQ (2-tert-butyl-9,10-N,N'-dicyanoanthraquinonediimine) and the like. The buffer layer may be formed by a variety of techniques including vacuum deposition, dip coating, spin coating, printing, spray coating, roll coating, etc.

The protective layer preferably has a double-layer structure of a first protective layer and a second protective layer as shown in FIGS. 1a and 1b. The first protective layer is made of a water-soluble organic material such as PVA (polyvinyl alcohol), and the second protective layer is made of an organic material crosslinkable by UV light or heat such as a photoactive or thermoactive polyacrylate. The structure of the protective layer is not specifically limited to the structure described herein, and various structures are possible.

Materials for the gate insulating layer of the organic thin film transistor according to the present invention include, but are not limited to, polyolefins, polyvinyls, polyacrylates, polystyrenes, polyurethanes, polyimides and derivatives thereof.

As materials for the organic semiconductor layer, materials commonly used in the art can be used. Specific examples of the materials include, but are not limited to, pentacenes, copper phthalocyanines, polythiophenes, polyanilines, polyacetylenes, polypyrroles, polyphenylene vinylenes and derivatives thereof.

As materials for the gate electrode and source-drain electrodes, metals and conductive polymers commonly used in the art can be used. Specific examples of the materials include, but are not limited to, gold (Au), silver (Ag), aluminum (Al), nickel (Ni), indium-tin oxides (ITOs), polythiophenes, polyanilines, polyacetylenes, polypyrroles, polyphenylene vinylenes, PEDOT(polyethylenedioxythiophene)/PSS(polystyrenesulfonate) mixtures and the like.

Specific Examples of materials for the substrate of the organic thin film transistor according to the present invention include, but are not limited to, glass, silicone, plastics and the like.

Hereinafter, the present invention will be described in more detail with reference to the following preferred examples. However, these examples are given for the purpose of illustration and are not to be construed as limiting the scope of the invention.

EXAMPLE 1

Fabrication of Organic Thin Film Transistor Comprising Buffer Layer and Protective Layer In this example, an organic thin film transistor having the structure shown in FIG. 1a was fabricated. First, Al was deposited on a washed glass substrate by a vacuum deposition technique to form a gate electrode with a thickness of 1,500 Å. A mixture of a polyimide-based material and a polyacrylate-based material was coated onto the gate electrode to a thickness of 7,000 Å by a spin coating at 2,000 rpm. The coating was baked at 100° C. for 10 minutes and 150° C. for 2 hours, sequentially, to form an organic gate insulating layer. Next, pentacene was deposited on the organic gate insulating layer by organic molecular beam deposition (OMBD) at a vacuum pressure of $2 \times 10^{-7}$ torr, a substrate temperature of 50° C. and a deposition rate of 0.85 Å/sec., to form an organic semiconductor layer with a thickness of 1,000 Å. Then gold was deposited on the organic semiconductor layer through a shadow mask having a channel length of 100 μm and a channel width of 0.5 mm to form source-drain electrodes with a thickness of 1,000 Å. In order to form a buffer layer, Alq3 was deposited to a thickness 1,000 Å at a substrate temperature of 30° C. and a deposition rate of 1 Å/sec. A first protective layer was formed by spin coating PVA on the buffer layer to a thickness of 300 Å by spin coating, followed by drying it in a convection oven at 100° C. for 10 minutes. Thereafter, a second protective layer was formed by spin coating PR (PC-403, JSR) to a thickness of 2 μm. The formed protective layer was soft-baked in a convection oven at 100° C. for 2 minutes, exposed to light for 20 seconds, and then hard-baked on a hot plate at 100° C. for 1 hour to fabricate an organic thin film transistor.

Figure 2A:
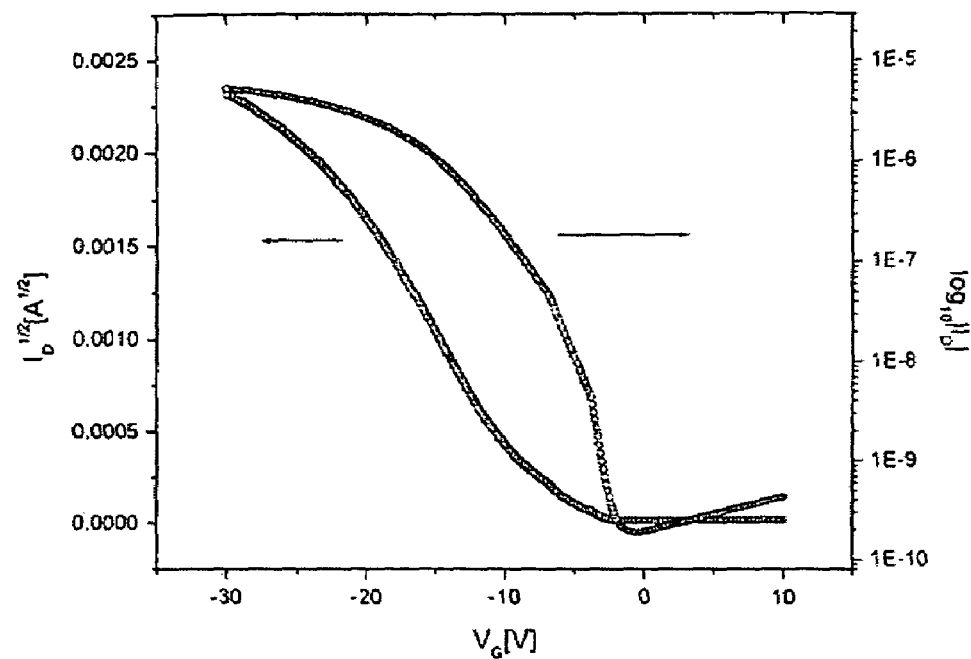
FIG. 2a is a graph showing the current transfer characteristics of an organic thin film transistor in an Example of the present invention, in which a buffer layer is formed and no protective layer is formed.
Figure 2B:
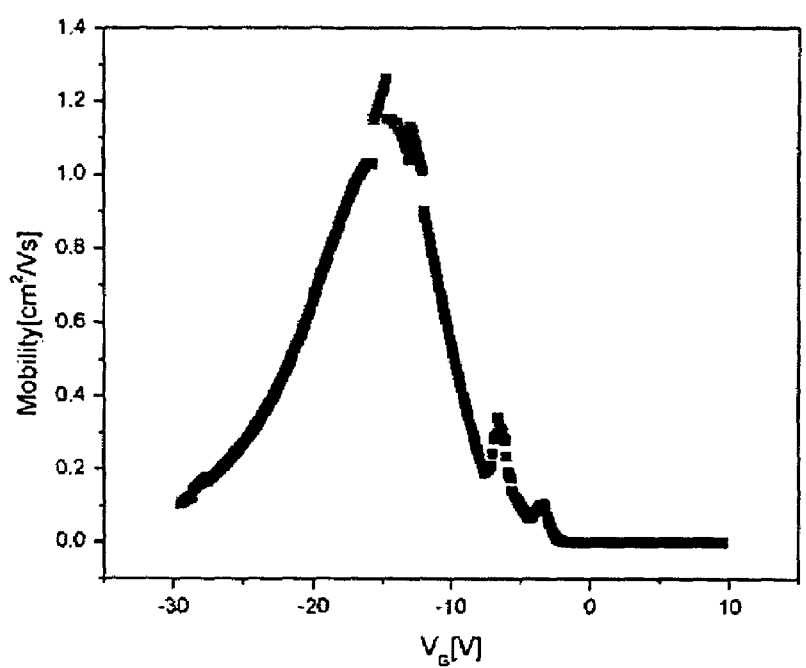
FIG. 2b is a graph showing the charge carrier mobility of an organic thin film transistor in an Example of the present invention, in which a buffer layer is formed and no protective layer is formed.
Figure 3A:
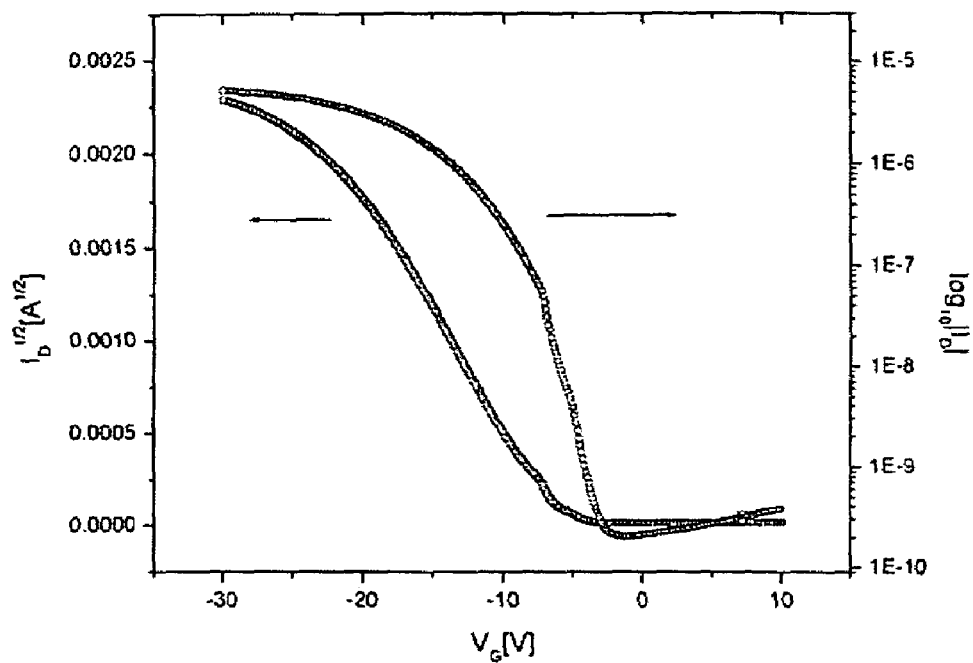
FIG. 3a is a graph showing the current transfer characteristics of an organic thin film transistor in an Example of the present invention, in which a buffer layer, a first protective layer and a second protective layer are formed.
Figure 3B:
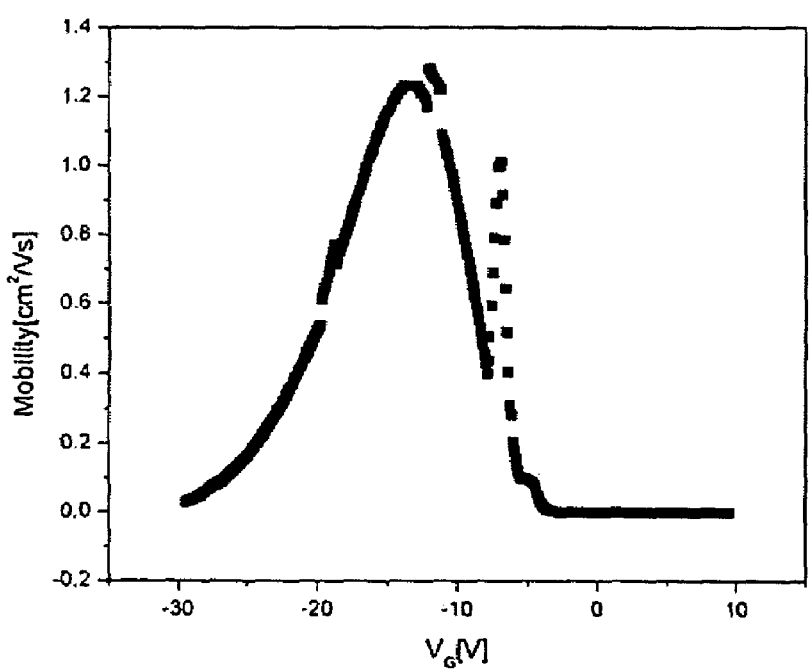
FIG. 3b is a graph showing the charge carrier mobility of an organic thin film transistor in an Example of the present invention, in which a buffer layer, a first protective layer and a second protective layer are formed.

Curves showing the current transfer characteristics and the charge carrier mobility of the device before formation of the protective layer were plotted using a KEITHLEY semiconductor characterization system (4200-SCS), and are shown in FIGS. 2a and 2b, respectively. Curves showing the current transfer characteristics and the charge carrier mobility of the final device in which the protective layer was formed were plotted using the same system and are shown in FIGS. 3a and 3b, respectively.

A curve showing the current transfer characteristics of the final device was plotted using a KEITHLEY semiconductor characterization system (4200-SCS). From the curve, the electrical properties of the device were calculated by the following procedures, and the results are shown in Table 1 below.

The charge carrier mobility of the devices was calculated by the following equation (4) from the slope of a graph representing the relationship between $(I_{SD})^{1/2}$ and $V_G$, wherein the graph was plotted according to the following current equations in saturation region (1) and (2) and the slope was calculated by the following equation (3):

$$I_{SD} = \frac{WC_0}{2L}\mu(V_G - V_T)^2 \quad (1)$$

$$\sqrt{I_{SD}} = \sqrt{\frac{\mu C_0 W}{2L}}(V_G - V_T) \quad (2)$$

$$\text{slope} = \sqrt{\frac{\mu C_0 W}{2L}} \quad (3)$$

$$\mu_{FET} = (\text{slope})^2 \frac{2L}{C_0 W} \quad (4)$$

In the above equations (1)~(4), $I_{SD}$: source-drain current; $\mu$ or $\mu_{FET}$: charge carrier mobility; $C_o$: capacitance of the insulating layer; W: channel width; L: channel length; $V_G$: gate voltage; and $V_T$: threshold voltage.

Threshold voltage($V_T$) was obtained from the intersection where the $V_G$ axis intersects the extension of the linear portion of the graph representing the relationship between $(I_{SD})^{1/2}$ and $V_G$. As the absolute value of the threshold voltage approximates to zero, the consumption of electric power decreases.

Off-state leakage current($I_{off}$) refers to the current flowing at the off-state and was determined by taking the minimum current at the off-state from the $I_{on}/I_{off}$ ratio. $I_{on}/I_{off}$ ratio is represented by the following equation (5):

$$\frac{I_{on}}{I_{off}} = \left(\frac{\mu}{\sigma}\right)\frac{C_0^2}{qN_A t^2}V_D^2 \quad (5)$$

In the above equation (5), $I_{on}$: maximum current; $I_{off}$: off-state leakage current; $\mu$: charge carrier mobility; $\delta$: conductivity of the active layer; q: electric charge; $N_A$: electric charge density; t: thickness of the insulating layer; $C_0$: capacitance of the insulating layer; and $V_D$: drain voltage. As can be seen from this equation, the larger the dielectric constant and the smaller the dielectric film thickness, the larger the obtained $I_{on}/I_{off}$ ratio. Therefore, the kind and thickness of the dielectric film are crucial factors for determining the $I_{on}/I_{off}$ ratio. The off-state leakage current is in inverse proportion to the $I_{on}/I_{off}$ ratio.

As evident from the equation above, as the dielectric constant of a dielectric film increases and the thickness decreases, the current ratio $I_{on}/I_{off}$ decreases. Accordingly, the kind and the thickness of the dielectric film are important factors in determining the current ratio. In this case, the off-state leakage current becomes low.

COMPARATIVE EXAMPLE

Fabrication of Organic Thin Film Transistor Comprising Protective Layer Without Formation of Buffer Layer An organic thin film transistor was fabricated in the same manner as in Example 1 above, except that a buffer layer was not formed.

Figure 4A:
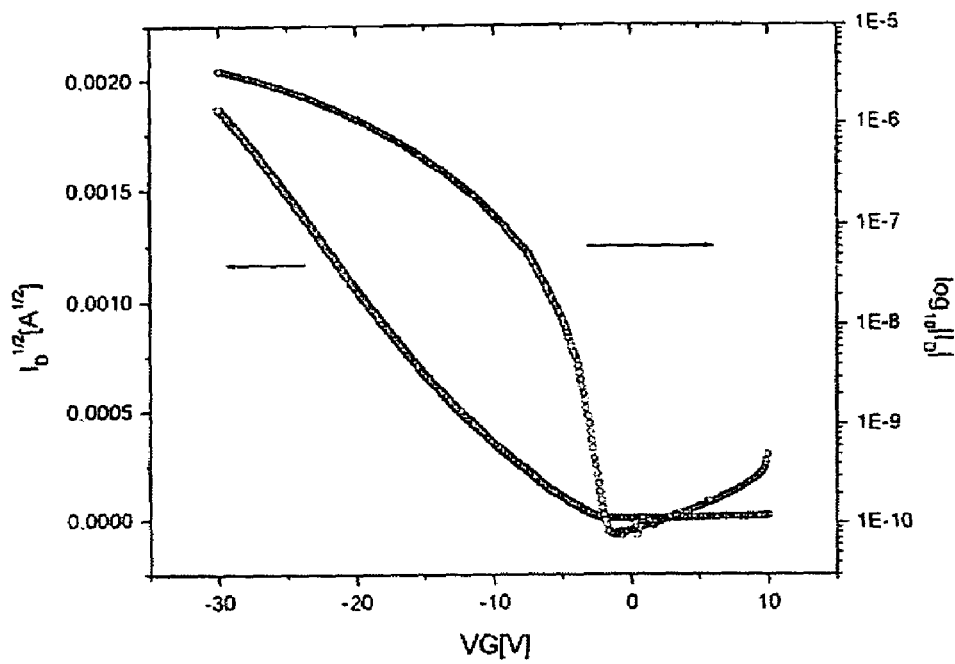
FIG. 4a is a graph showing the current transfer characteristics of an organic thin film transistor in a Comparative Example of the present invention, in which an active layer is formed and no protective layer is formed.
Figure 4B:
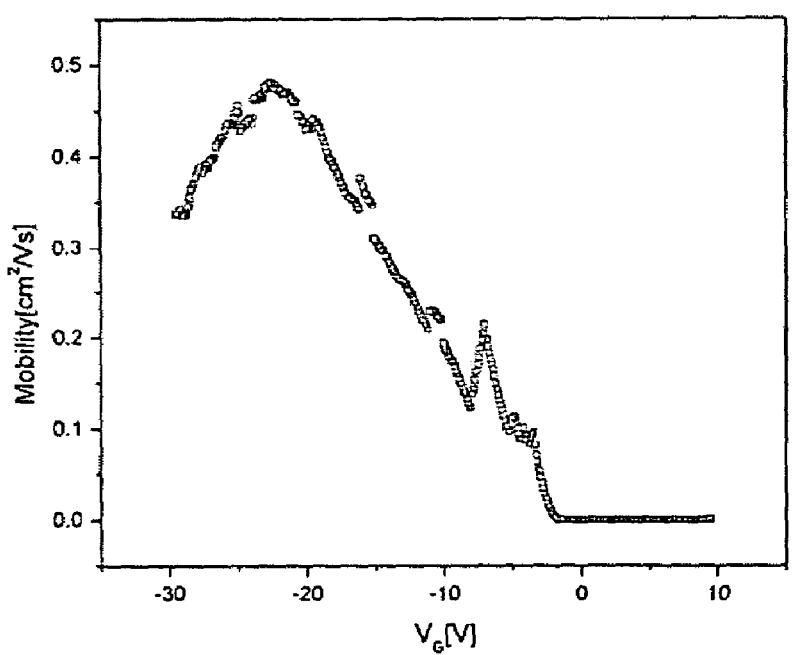
FIG. 4b is a graph showing the charge carrier mobility of an organic thin film transistor in a Comparative Example of the present invention, in which an active layer is formed and no protective layer is formed.
Figure 5A:
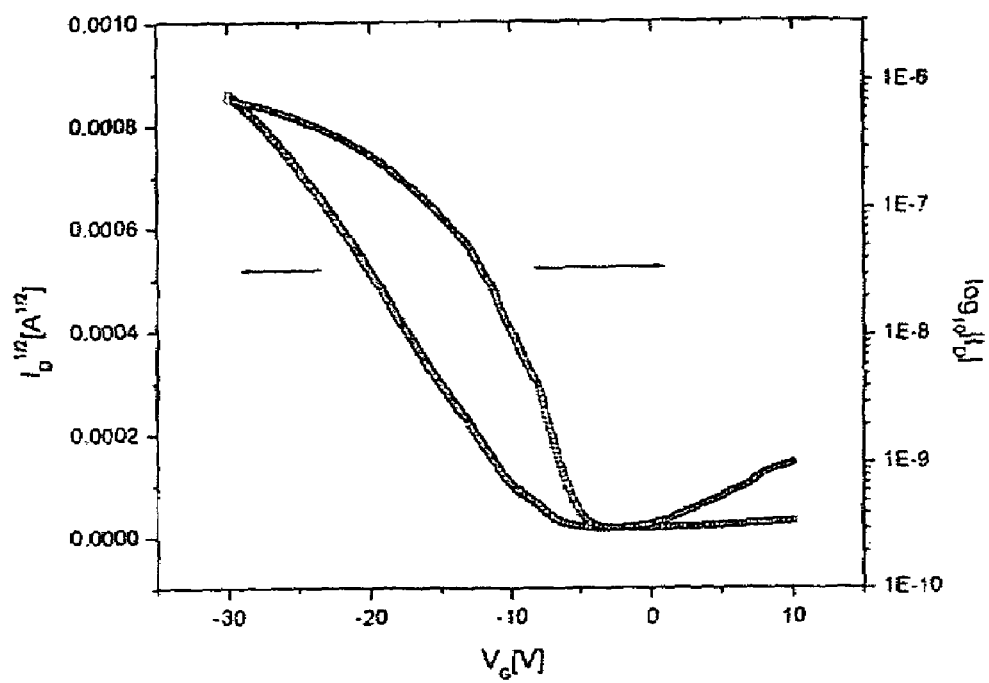
FIG. 5a is a graph showing the current transfer characteristics of an organic thin film transistor in a Comparative Example of the present invention, in which an active layer, a first protective layer and a second protective layer are formed.
Figure 5B:
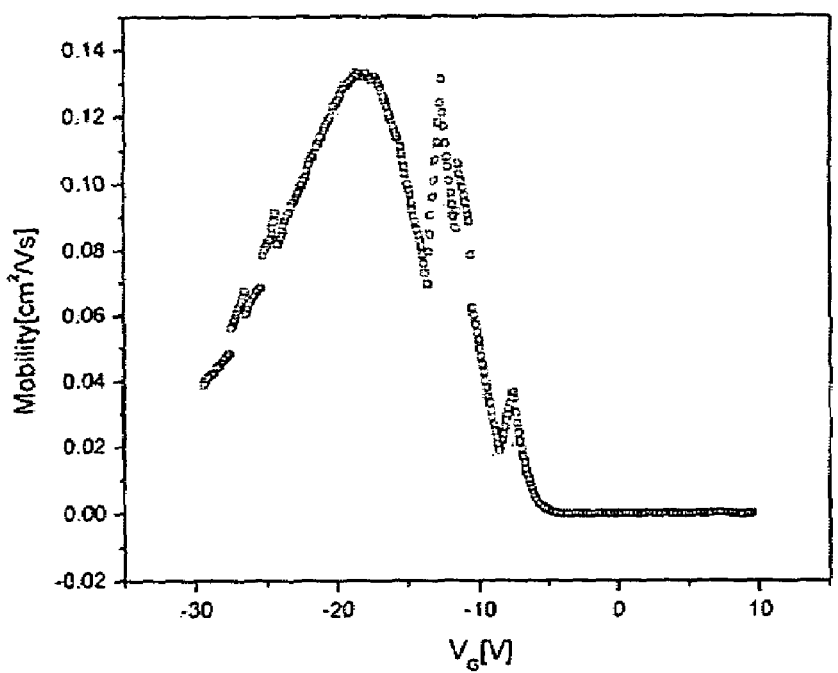
FIG. 5b is a graph showing the charge carrier mobility of an organic thin film transistor in a Comparative Example of the present invention, in which an active layer, a first protective layer and a second protective layer are formed.

Curves showing the current transfer characteristics and the charge carrier mobility of the device before formation of the protective layer are shown in FIGS. 4a and 4b, respectively. Curves showing the current transfer characteristics and the charge carrier mobility of the final device in which the protective layer was formed are shown in FIGS. 5a and 5b, respectively.

TABLE 1

| | | Charge carrier mobility (cm²/Vs) | Threshold voltage (V) | Off-state leakage current (A) | $I_{on}/I_{off}$ Ratio |
|---|---|---|---|---|---|
| Example | Before formation of protective layer | 1.2 | −7 | $1.90 \times 10^{-10}$ | $3.03 \times 10^4$ |
| | After formation of protective layer | 1.2 | −6.5 | $2.00 \times 10^{-10}$ | $2.60 \times 10^4$ |
| Comparative Example | Before formation of protective layer | 0.48 | −8 | $8.20 \times 10^{-11}$ | $4.27 \times 10^4$ |
| | After formation of protective layer | 0.13 | −8 | $2.50 \times 10^{-10}$ | $2.96 \times 10^3$ |

As can be seen from Table 1, in the case of the device in which a protective layer was formed and a buffer layer was not formed, the performance of the device was decreased by about 70%. In contrast, the performance of the device in which a buffer layer was formed was decreased by 10% only, and nearly unchanged from the initial state.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic thin film transistor comprising a substrate, a gate electrode, a gate insulating layer, an organic semiconductor layer, source-drain electrodes and a protective layer wherein a buffer layer is interposed between the organic semiconductor layer and the protective layer, wherein the buffer layer is made of an organic material having a resistance of $10^6$ ohm-cm or more.

2. The organic thin film transistor according to claim 1, wherein the organic material is selected from a group consisting of Alq3 (tris(8-hydroxyquinoline) aluminum), BAlq3 (bis(2-methyl-8-quinolato)(p-phenyl-phenolato)aluminum), PTCDA (perylenetetracarboxylicdianhydride), DPS (dicyano substituted diphenylsulfone), TCNQ (tetracyano-quinodimethane) and DCAQ (2-tert-butyl-9, 10-N,N'-dicyanoanthraquinonediimine).

3. The organic thin film transistor according to claim 2, wherein the buffer layer is formed by vacuum deposition, dip coating, spin coating, printing, spray coating or roll coating.

4. An organic thin film transistor comprising a substrate, a gate electrode, a gate insulating layer, an organic semiconductor layer, source-drain electrodes and a protective layer wherein a buffer layer is interposed between the organic semiconductor layer and the protective layer, wherein the buffer layer is made of an organic material having a resistance of $10^6$ ohm-cm or more, wherein the protective layer consists of a first protective layer made of a water-soluble organic material and a second protective layer made of an organic material crosslinkable by UV light or heat.

5. The organic thin film transistor according to claim 4, wherein the water-soluble organic material is polyvinyl alcohol, and the organic material crosslinkable by UV light or heat is a photoactive or thermoactive polyacrylate.

6. The organic thin film transistor according to claim 1, wherein the gate insulating layer is made of a material selected from a group consisting of polyolefins, polyvinyls, polyacrylates, polystyrenes, polyurethanes, polyimides and derivatives thereof.

7. The organic thin film transistor according to claim 1, wherein the organic semiconductor layer is made of a material selected from a group consisting of pentacenes, copper phthalocyanines, polythiophenes, polyanilines, polyacetylenes, polypyrroles, polyphenylene vinylenes and derivatives thereof.

8. The organic thin film transistor according to claim 1, wherein the gate electrode and the source-drain electrodes are made of a material selected from a group consisting of gold, silver, aluminum, nickel, indium-tin oxides, polythiophenes, polyanilines, polyacetylenes, polypyrroles, polyphenylene vinylenes, and PEDOT(polyethylenedioxythiophene)/PSS(polystyrenesulfonate) mixtures.

9. The organic thin film transistor according to claim 1, wherein the substrate is made of glass, silicone or plastic.

10. The organic thin film transistor according to claim 1, wherein the protective layer consists of a first protective layer made of a water-soluble organic material and a second protective layer made of an organic material crosslinkable by UV light or heat.

11. The organic thin film transistor according to claim 1, wherein the water-soluble organic material is polyvinyl alcohol, and the organic material crosslinkable by UV light or heat is a photoactive or thermoactive polyacrylate.

* * * * *